US 6,621,082 B2

(12) United States Patent
Morita et al.

(10) Patent No.: US 6,621,082 B2
(45) Date of Patent: Sep. 16, 2003

(54) AUTOMATIC FOCUSING SYSTEM FOR SCANNING ELECTRON MICROSCOPE EQUIPPED WITH LASER DEFECT DETECTION FUNCTION

(75) Inventors: Seiji Morita, Chiba (JP); Mitsuyoshi Sato, Chiba (JP); Atsushi Uemoto, Chiba (JP)

(73) Assignee: Seiko Instruments Inc, Chiba (JP)

( * ) Notice: Subject to any disclaimer, the term of this patent is extended or adjusted under 35 U.S.C. 154(b) by 0 days.

(21) Appl. No.: 10/171,797

(22) Filed: Jun. 13, 2002

(65) Prior Publication Data

US 2003/0006372 A1 Jan. 9, 2003

(30) Foreign Application Priority Data

Jun. 19, 2001 (JP) ........................................ 2001-184697

(51) Int. Cl.[7] ............................. G01N 23/00; G21K 7/00
(52) U.S. Cl. .................... 250/310; 250/307; 250/492.2; 250/559.45; 250/559.48; 250/201.3; 324/750; 324/765; 359/368; 359/383
(58) Field of Search ................................ 250/310, 311, 250/307, 492.2, 559.45, 559.48, 201.3; 324/750, 765; 359/368, 383

(56) References Cited

U.S. PATENT DOCUMENTS

| | | | | |
|---|---|---|---|---|
| 4,945,220 A | * | 7/1990 | Mallory et al. | 250/201.3 |
| 5,231,279 A | * | 7/1993 | Nakamura | 250/201.2 |
| 5,300,776 A | * | 4/1994 | Krivanek | 250/307 |
| 5,672,861 A | * | 9/1997 | Fairley et al. | 250/201.3 |
| 5,995,143 A | * | 11/1999 | Price et al. | 348/345 |
| 6,407,373 B1 | * | 6/2002 | Dotan | 250/201.3 |

* cited by examiner

*Primary Examiner*—John R. Lee
*Assistant Examiner*—James P. Hughes
(74) *Attorney, Agent, or Firm*—Hogan & Hogan, LLP

(57) ABSTRACT

A scanning electron microscope equipped with a laser defect detection function has an automatic focusing function that performs the steps of: obtaining a deviation (offset) amount between focal positions of an optical microscope and a scanning electron microscope; detecting a defect by a laser dark-field image of the optical microscope; analyzing the dark-field image to readjust a focus of the optical microscope to adjust a height of the optical microscope; and automatically adjusting a focus of the scanning electron microscope by adding a readjusted amount of the focus of the optical microscope to the offset amount before an observation is conducted by the scanning electron microscope.

20 Claims, 2 Drawing Sheets

In Focus

Out of Focus by 50µ m

AUTOMATIC FOCUSING SYSTEM FOR SCANNING ELECTRON MICROSCOPE EQUIPPED WITH LASER DEFECT DETECTION FUNCTION

BACKGROUND OF THE INVENTION

1. Field of the Invention

The present invention relates to an automatic focusing system for a scanning electron microscope equipped with a laser defect detection function, which is used to control the yield in semiconductor manufacturing processes.

2. Related Background Art

A major factor that leads to defective products in manufacturing super-highly integrated LSIs in recent years is said to result from by micro foreign matters that adhere to wafers. More particularly, the micro foreign matters turn into pollutants that cause breakage and short circuit of circuit patterns, which lead to a great extent to occurrence of defects in semiconductor chips and their lowered quality and reliability. With the miniaturization of circuit patterns, micro foreign matters having diameters on the order of 0.1 λm could be problematical. For this reason, it has become the most important objective, for controlling the process and improving yield in manufacturing super-highly integrated LSIs, to quantitatively and accurately measure, analyze and understand conditions of adhesion of micro foreign matters.

Currently, a particle examination apparatus shown in FIG. 1 is used for a method to quantitatively and accurately measure and analyze actual conditions of adhesion of micro foreign matters. This apparatus can display on a CRT 9 three types of images, ① a scanning electron microscope image, ② a high-sensitive dark-field image obtained by a high-sensitive CCD camera 4, and ③ a dark-filed image or a bright-field image obtained by a CCD camera 5. A scanning electron microscope 1 is equipped with a lens barrel section 11, and a secondary electron detector (SED) 12. The lens barrel section 11 is equipped with a deflection device that deflects and scans an electron beam to be irradiated onto a sample 6. The SED 12 detects secondary electrons that are flipped out from the sample 6 by the electron beam. The detected data is associated with positions of the irradiated beam to be imaged, which provides the scanning electron microscope image ①.

A light source 8 emits light, which is passed through an optical path and is irradiated from above as a light spot on a surface of the sample. When the sample surface has a mirror surface, the light is uniformly reflected on the surface, but is scattered when there are discrete configurations that may be caused by foreign matters or the like. Based on the reflection or scattering of the light, the bright-field image ③ is obtained by photographing the sample surface from above with the CCD camera 5.

A laser light source 7 emits a laser beam, which is diagonally irradiated from above on the sample surface. When the sample surface has a mirror surface, a total internal reflection of the laser beam occurs, but the laser beam is scattered at a foreign matter or the like that may be present on the sample surface. According to the total internal reflection or scattering of the laser beam, the dark-field image ③ is obtained by photographing the sample surface from above with the CCD camera 5.

The high-sensitive dark-field image ② is basically the same as the dark-field image ③, but this is an image obtained by the high-sensitive CCD camera 4 that enables observation of even smaller particles. Because subjects are ultrafine particles, and scattered light caused by ultrafine particles is very weak, a high-sensitive CCD (ICCD) camera is used.

Detection of defects is conducted by this apparatus in the following manner. A microscope image ③ or ② is photographed based on defect position information that has been obtained by another defect detection apparatus to obtain correct positional information of defects on a sample with respect to a reference position of the apparatus. Then, the defects are observed and analyzed by the scanning electron microscope. More specifically, first, positions of relatively large foreign matters with respect to a reference position of the apparatus are detected by using a bright-field image or a dark-field image of a relatively low magnification. The number and distribution condition of these defects may also be detected if required. To obtain a bright-field image, a control box 15 is operated with a computer 10 whereby a light source 8 is lit so that a surface of the sample is irradiated with a light spot from above, and the ordinary CCD camera 5 is used to photograph the image. To photograph a dark-field image, the control box 15 is operated with the computer 10 whereby a laser light source is lit to irradiate the surface of the sample with a laser beam, and the ordinary CCD camera 5 is used to photograph the image. The following examination is conducted for micro foreign matters whose presence could not be confirmed by the initial examination described above. The ICCD camera 4 with a higher sensitivity is used to photograph a high magnification dark-field image of the micro foreign matters. This enables detection of positions of the fine foreign matter particles that cannot be observed by the initial examination with respect to the reference position of the apparatus. The number and distribution condition of these micro foreign matters may also be detected if required. The scanning electron microscope is positioned based on the positional information of the target foreign matters, which is specified by the examination operations described above, and the target foreign matters are observed. Minute amounts of displacements that cannot be handled by the driving mechanism of the sample stage are treated as information on coordinates of the screen, which enables the deflection device of the electron optical system to handle such minute amounts of displacements. Although compositions of target foreign particles cannot be analyzed by a high-magnification optical image or a scanning microscope image obtained by detecting secondary electrons, they can be analyzed by using an electron microscope with a secondary X-ray detecting (EDS) function. This enables to specify causes of the defects more effectively.

However, in the defect detection method in which an optical microscope is used to observe scattered light of a laser beam, since the focal depth of the optical system is deep, defects can be detected to some degree even when the focal point of the optical microscope is not located on the wafer surface. However, since the scanning electron microscope has a shallow focal depth, it is difficult to observe defects in the size of 0.1 $\mu$m when the focusing surface shifts by 10 $\mu$m or more. For this reason, when defects are spotted with the laser beam, and such defects are to be observed by a scanning electron microscope, the defects may often move out of the focal point of the scanning electron microscope. In such a case, the defects (particles) cannot be observed. Moreover, since defects to be observed are extremely small, it would take a substantially long time to readjust the focus, which deteriorates the work efficiency.

SUMMARY OF THE INVENTION

The present invention relates to a function to maintain a focused condition without wasting time and labor in a system for observing and analyzing particle defects when positions of the defects specified by a dark-field image of an optical microscope are observed by a scanning electron microscope.

In accordance with an embodiment of the present invention, an automatic focusing function of a scanning electron microscope equipped with a laser defect detection function performs the steps of: correctly obtaining a shift (offset) amount between focal positions of an optical microscope and a scanning electron microscope; detecting at least one defect by a laser dark-field image of the optical microscope; then analyzing the dark-field image to readjust a focus of the optical microscope and adjust a height of the optical microscope; and automatically adjusting a focus of the scanning electron microscope by adding a readjusted amount of the focus of the optical microscope to the offset amount before an observation is conducted by the scanning electron microscope.

Also, the step of analyzing the dark-field image to readjust a focus of the optical microscope comprises a step of seeking a minimum defect area, a step of seeking a defect area having a brightest luminance, a step of seeking a defect area that provides a maximum differential value as a result of differential scanning of the dark-field image on a screen on the optical microscope, or a step combining at least two of the steps.

In the examination of particle defects, the automatic focusing function is capable of selecting one of a mode that extract one defect on the screen, a mode that extracts a plurality of defects on the screen, and a mode that extracts all defects on the screen.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

FIGS. 2(a) and 2(b) show laser dark-field images of foreign matters particles on a silicon wafer, which are photographed by a high-sensitive CCD camera, in which FIG. 2(a) shows an image in focus and FIG. 2(b) shows an image that is out of focus.

EMBODIMENTS OF THE PRESENT INVENTION

Minute foreign matters that are present on a surface of a planate sample such as a silicon wafer can be detected by using a scanning electron microscope equipped with a laser defect detection function and analyzed. However, when minute foreign matters whose positions have been specified by a dark-field image obtained by the laser irradiation are subject to an observation by the scanning electron microscope, such observation may not be immediately conducted as it may take time to readjust the image. As described above, in the case of a scanning electron microscope, an image formed by the scanning electron microscope is blurred when the image is not in focus because its focal depth is shallow. Observation of extremely small particles is thus impossible if the image is not in focus.

In accordance with an embodiment of the present invention, a scanning electron microscope is provided with an automatic focusing function so that observation by the scanning electron microscope can be quickly conducted.

A focal position of an optical microscope that provides laser dark-field images is accurately detected to provide a focus signal, and a focal position of the scanning electron microscope is obtained based on the focus signal, whereby an electron optical system (that includes the scanning electron microscope) is controlled. Since the laser optical system has a relatively large focal depth, the sample surface can be observed even when the focal position of the laser optical system is slightly shifted from the sample surface. However, deviations in the focal position with respect to the sample surface affect the sharpness of formed images. In accordance with the present embodiment, the brightness of an image is observed, and a focal position that provides the image with the brightest luminance is determined to be a focused position.

Figure 2:
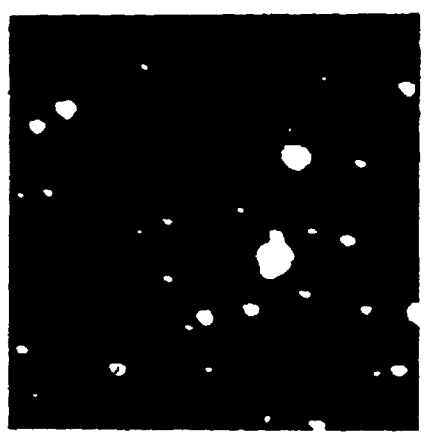
Figure 2:
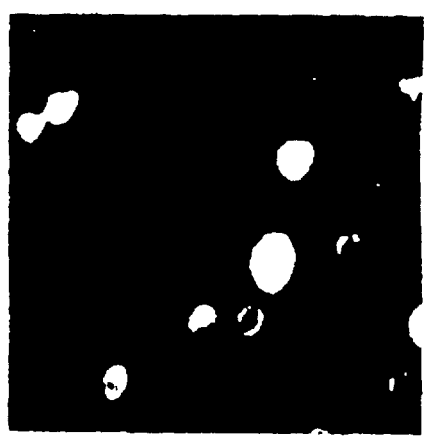
Figure 3:
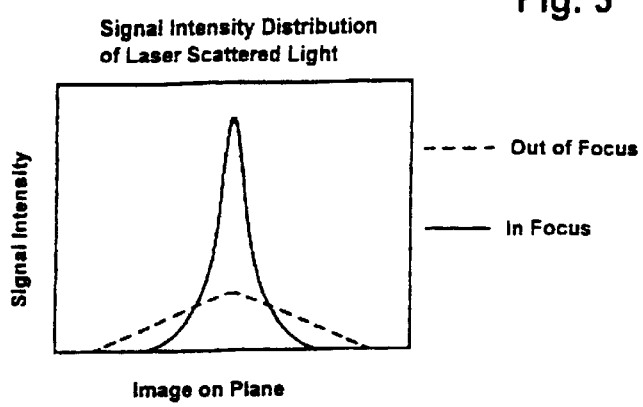
FIG. 3 is a graph showing distributions of signals of laser scattered light on the surface of a microscope image.

FIG. 2(a) shows a microscope image that is in focus in the laser dark-field microscope, and FIG. 2(b) shows a microscope image that is out of focus by 50 $\mu$m. As indicated in FIG. 3, the laser beam scattered by minute particles, i.e., foreign matters, gives a larger light area of the scattered laser beam when the image is out of focus. As a result, an area of the defect is shown to be larger and the luminance thereof is lower. In contrast, an image that is in focus gives a smaller light area of the scattered laser beam and a greater luminance. Therefore, when the image is in focus, the presence of the minute particles can be clearly discriminated. In contrast, when the image is out of focus, the presence of the minute particles cannot be discriminated as shown in FIG. 2(a), and relatively large particles are observed as dim expanded areas as shown in FIG. 2(b). In this example, relatively many particles of different sizes are to included in order to clearly show the difference between the image that is in focus and the image that is out of focus. However, an actual microscope image may contain as little as one foreign matter.

The brightness of the laser dark-field microscope image is observed, and a focal position that gives the sharpest image may be determined to be a focused position based on the following three methods:

a) To determine a focused position where a scattered image becomes the smallest in size;

b) To determine a focused position where a luminance signal becomes the highest; and c) To determine a focused position where a differential value of a luminance signal obtained by scanning across an image screen becomes the highest.

The method a) focuses on the phenomenon in which, when an image is not in focus, the image dimly expands outwardly. The method b) focuses on the phenomenon in which, when an image is not in focus, the image becomes dim and the light is also diffused. The method c) focuses on the phenomenon in which, when an image is not in focus, the image becomes obscure, and the image boundary becomes unclear.

When an accurate focused position of the optical microscope is obtained by any one of the methods, information representative of the accurate focused position is used as a control signal for bringing the scanning electron microscope in focus. However, without knowing positional relationships between the focal position of the optical microscope and the focal position of the scanning electron microscope, the information representing the accurate focused position of the optical microscope cannot be reflected on the control signal that brings the scanning electron microscope in focus. Accordingly, in accordance with the embodiment of the present invention, a deviation (offset) amount between focal positions of the two optical systems is obtained in advance. The information representing the accurate focused position of the optical microscope is added to the initial offset amount, which is then used as a control signal that brings the scanning electron microscope in focus. By doing so, when a micro foreign matter discovered by a dark-field image obtained by laser irradiation is subject to an observation by the scanning electron microscope, the focus of the scanning electron microscope can be quickly and automatically controlled.

Figure 4:
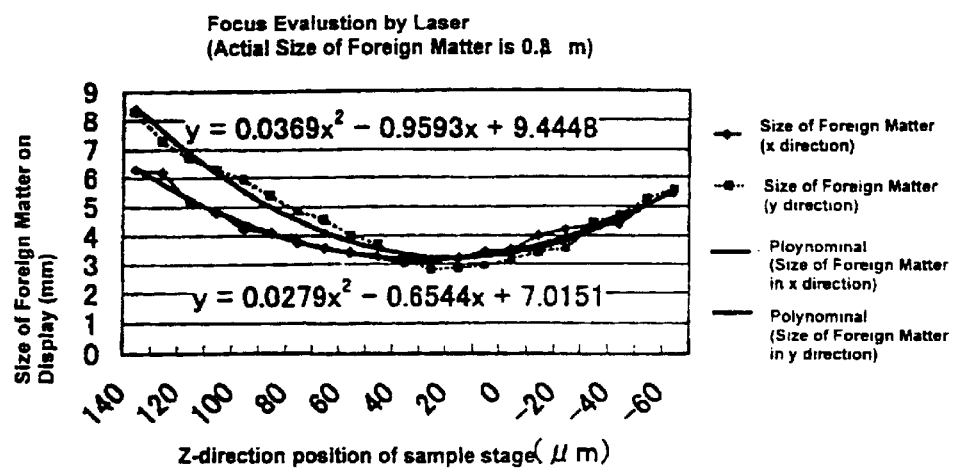
FIG. 4 is a graph showing measured values of images of a foreign matter of an actual size of 0.3 $\mu$m, which are viewed on a screen with the z-axis position being changed.

A foreign particle in an actual size of 0.3 µm that is present on a sample surface is measured while the sample stage is moved in the z-axis direction in different positions to see how images of the particle are measured on a screen at the respective different positions. FIG. 4 is a graph showing results of the measurement. Values plotted with diamond-shaped dots are measurements in the x-axis direction, and values plotted with squire-shaped dots are measurements in the y-axis direction. As shown in the graph, images of the foreign particle in an actual size of 0.3 µm present different measurements in the x-direction and the y-direction in accordance with deviations from the focal point. This happens because the laser beam is irradiated in the x-axis direction. Solid lines on the graph indicate values of an approximate polynominal calculated on a machine based on actually measured input data. This approximate expression can be used to obtain positions with the minimum measurements in the x-direction and the y-direction (i.e., the minimum values on the graph), and a focused position can be automatically calculated.

Figure 1:
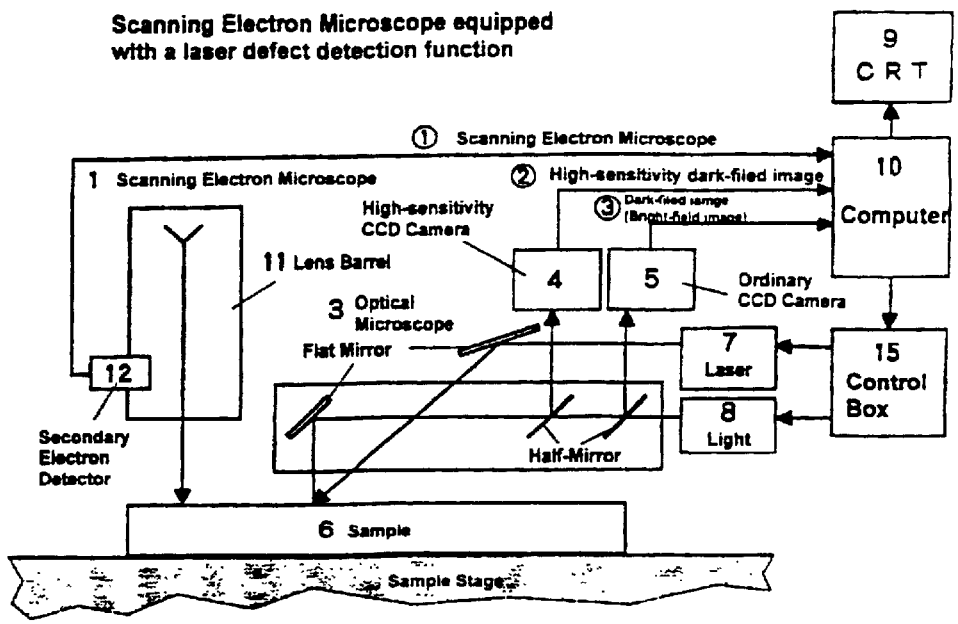
FIG. 1 shows a basic structure of a scanning electron microscope system equipped with a laser defect detection function that realizes an automatic focusing system in accordance with an embodiment of the present invention.

Referring to FIG. 1, a description is made as to a system that realizes the automatic focusing system in accordance with one embodiment of the present embodiment in a scanning electron microscope equipped with a laser defect detection function.

A computer 10 has a memory section that stores information for relative positions of optical axes of the optical microscope and the scanning electron microscope, which are fixed values unconditionally defined by positional relations of the apparatuses, and amounts of mutual relation (offset) between the focal position of the optical microscope and the focal position of the scanning electron microscope. The computer 10 may include at least one of: a) a device that integrates the number of pixels having luminance values over a set region based on image information provided by the optical microscope 3, and calculates an area thereof, b) a device that stores a peak value of luminance signals; and c) a device that raster-scans an image, calculates differential values of the luminance signals, and stores its peak value. In one embodiment, the computer includes three of the devices a), b) and c) described above. The computer 10 further includes a device that stores, when the height of the sample is changed by moving the sample stage in the z-axis direction (an optical axis direction), the z-axis positional information and results of repeated calculations obtained by the devices a), b) and c), and specifies positional information that gives an optimum value obtained by each of the devices a), b) and c). An optimum value can be a smallest image area for a defect in the case of the device a), an image for a defect having a brightest luminance in the case of the device b), and an image area for a defect that provides a maximum differential value obtained as a result of differential scanning of the dark-field image on a screen of the optical microscope in the case of the device c).

When the calculation results obtained through the devices a), b) and c) specify the same positional information, then that positional information is determined to represent a focused position of the optical microscope. However, when they specify different positional information, a majority among the different positional information sets may be selected, or one of them may be manually selected to represent a focused position of the optical microscope. This is because which of the determination methods is suitable depends on defective conditions.

When the focused position of the foreign matter is specified with the optical microscope, the operational function of the computer 10 is used to add a value representative of the focused position obtained by the optical microscope to the offset amount between the focal position of the optical microscope and the focal position of the scanning electron microscope stored in the memory section, to thereby calculate a focused position of the scanning electron microscope. The value thus obtained is a control target value, and the automatic focusing of the scanning electron microscope is conducted by a servo-system based on the value. Since the optical axis of the optical microscope and the optical axis of the scanning electron microscope are separated from one another by several mm, these optical axes need to be matched initially in order to observe the same foreign matter. This can be done by using the information stored as the fixed values in the memory section. Each time observation is switched from one of the microscopes to the other, positional controls are conducted by driving the sample stage in the x-axis direction (or the y-axis, or a composite direction of the x and y axes), the automatic focusing operation of the scanning electron microscope is performed.

Furthermore, the examination of particle defects in accordance with the present invention is capable of selecting one of a mode that extracts one defect on the screen, a mode that extracts a plurality of defects on the screen, and a mode that extracts all defects on the screen. In the mode that extracts one defect on the screen, there is only one object to be examined, and therefore the microscope focal position information obtained from an image of the dark-field image laser microscope may be reflected on the focusing control signal for the scanning electron microscope. However, in the mode that extracts a plurality of defects on the screen, the position (on an x-y plane) and the focal position (a z-axis component) of each of the foreign matters need to be obtained. The focal position does not change if the sample surface is perfectly flat and the particle sizes are the same. However, in effect, a sample surface includes concaves and convexes, warps and the like, and particles differ in size. Therefore, in the focusing operation of a scanning electron microscope in which a 0.1 µm difference causes a problem, each of the particles needs to be specified. Moreover, although positioning in the x-y plane may be accommodated by driving of the sample stage in the x-axis and the y-axis, positioning within the screen of the microscope apparatus may not often be handled by such a mechanical driving system. In this case, minute amounts of displacements that cannot be handled by the mechanical driving system of the sample stage are treated as positional information on coordinates of the screen, which enables a deflection device of the electron optical system to handle such minute amounts of displacements.

An automatic focusing method for a scanning electron microscope equipped with a laser defect detection function, in accordance with the present invention, comprises the steps of: obtaining an correct deviation (offset) amount between focal positions of an optical microscope and a scanning electron microscope; detecting a defect by a laser dark-field image of the optical microscope; analyzing the dark-field image to readjust a focus of the optical microscope to adjust a height of the optical microscope; and automatically adjusting a focus of the scanning electron microscope by adding a readjusted amount of the focus of the optical microscope to the offset amount before an observation is conducted by the scanning electron microscope. As a result, when observation and analysis are to be conducted by a scanning electron microscope followed by observation by a dark-field image laser microscope, the scanning electron microscope can automatically, quickly perform an automatic focusing without taking much time and labor to adjust the focus thereof.

Also, in the present invention, the step of analyzing the dark-field image to readjust a focus of the optical microscope may use a step of seeking a minimum defect area, a step of seeking a defect area having a brightest luminance, a step of seeking a defect area that provides a maximum differential value as a result of differential scanning of the image on a screen of the optical microscope, or a step combining these steps. Accordingly, when the different steps described above provide the same result, it can be confirmed that data representative of the result is highly reliable. On the other hand, when different results are obtained, one of the determination steps that provides an optimum result may be selected according to the types of defects.

A scanning electron microscope equipped with a laser defect detection function in accordance with the present invention pertains to a particle defect examination apparatus that includes an optical microscope and a scanning electron microscope that are located adjacent to a sample stage equipped with a driving system having at least three (x, y and z) axial directions of movements, the scanning electron microscope comprising: a storage device that stores a deviation (offset) amount between focal positions of the optical microscope and the scanning electron microscope; an analysis device that performs an analysis to find a focused position of the optical microscope based on a laser dark-field image obtained by the optical microscope; and a device that automatically adjusts a focus of the scanning electron microscope by adding a readjusted amount of the focus of the optical microscope to the offset amount. As a result, the system that realizes the automatic focusing function of the present invention can be achieved by improving the functions within a computer without requiring special hardware to be added to the current apparatus.

Furthermore, in the particle defect examination apparatus, the particle defect examination has a structure that is capable of selecting one of a mode that extracts one defect on the screen, a mode that extracts a plurality of defects on the screen, and a mode that extracts all defects on the screen. As a result, even when many particle defects are present, observations by the two optical systems do not have to be frequently repeated, and the examination of the defects can be effectively conducted. While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An automatic focusing method used by a scanning electron microscope equipped with a laser defect detection function, the method comprising:

obtaining an accurate offset amount between focal positions of an optical microscope and a scanning electron microscope;

detecting a defect by a laser dark-field image provided by the optical microscope;

analyzing the dark-field image to readjust a focus of the optical microscope;

automatically adjusting a focus of the scanning electron microscope by adding a readjusted amount of the focus of the optical microscope to the offset amount before an observation is conducted by the scanning electron microscope.

2. An automatic focusing method of a scanning electron microscope equipped with a laser defect detection function according to claim 1, wherein the step of analyzing the dark-field image to readjust a focus of the optical microscope comprises one of a step of seeking a minimum defect area, a step of seeking a defect area having a brightest luminance, a step of seeking a defect area that provides a maximum differential value obtained as a result of differential scanning of the dark-field image on a screen of the optical microscope, and a step that combines the steps.

3. A particle defect examination apparatus comprising a scanning electron microscope equipped with a laser defect detection function by use of an optical microscope, the particle defect examination apparatus comprising:

a storage device that stores an accurate offset amount between focal positions of the optical microscope and the scanning electron microscope;

an analysis device that performs an analysis to find a focused position of the optical microscope based on a laser dark-field image obtained by the optical microscope; and a device that automatically adjusts a focus of the scanning electron microscope by adding a readjusted amount of the focus of the optical microscope to the offset amount.

4. A particle defect examination apparatus according to claim 3, wherein the optical microscope and the scanning electron microscope are located adjacent to a sample stage equipped with a driving system having at least three (x, y and z) axial directions of movements.

5. A particle defect examination apparatus according to claim 3, wherein the analysis device selects one of a mode of seeking a minimum defect area, a mode of seeking a defect area having a brightest luminance, a mode of seeking a defect area that provides a maximum differential value as a result of differential scanning of the dark-field image on a screen on the optical microscope, and a mode that combines the modes.

6. A particle defect examination apparatus according to claim 3 wherein the analysis device selects one of a mode that extracts one defect on a screen displaying the dark field image, a mode that extracts a plurality of defects on the screen, and a mode that extracts all defects on the screen.

7. A particle defect examination apparatus according to claim 3, wherein the analysis device includes a device that extracts one defect from the laser dark-field image on a screen displaying the dark field image.

8. A particle defect examination apparatus according to claim 3, wherein the analysis device includes a device that extracts a plurality of defects from the laser dark-field image on a screen displaying the dark field image.

9. A particle defect examination apparatus according to claim 3, wherein the analysis device includes a device that extracts all defects from the laser dark-field image on a screen displaying the dark field image.

10. A particle defect examination apparatus comprising:
an optical microscope that photographs an image of at least one defect;
a scanning electron microscope;
a storage device that stores an accurate offset amount between focal positions of the optical microscope and the scanning electron microscope;
an analysis device that analyzes the image to readjust a focused position of the optical microscope; and
a device that automatically adjust a focus of the scanning electron microscope by adding a readjusted amount of the focused position of the optical microscope to the offset amount.

11. A particle defect examination apparatus according to claim 10, wherein the analysis device includes a device that extracts one defect from the laser dark-field image on the screen.

12. A particle defect examination apparatus according to claim 10, wherein the analysis device includes a device that extracts a plurality of defects from the laser dark-field image on the screen.

13. A particle defect examination apparatus according to claim 10, wherein the analysis device includes a device that extracts all defects from the laser dark-field image on the screen.

14. A particle defect examination apparatus according to claim 10, wherein the analysis device includes a device that obtains an image having a minimum area provided by the optical microscope.

15. A particle defect examination apparatus according to claim 10, wherein the analysis device includes a device that obtains a peak value of a luminance signal from the image obtained by the optical microscope.

16. A particle defect examination apparatus according to claim 10, wherein the analysis device includes a device that specifies a defect area that provides a maximum differential value as a result of differential scanning of the image on a screen on the optical microscope.

17. A particle defect examination apparatus according to claim 10, wherein the analysis device includes: a first device that obtains an image having a minimum area provided by the optical microscope; a second device that obtains a peak value of a luminance signal from the image obtained by the optical microscope; and a third device that specifies a defect area that provides a maximum differential value as a result of differential scanning of the image on a screen on the optical microscope.

18. A particle defect examination apparatus according to claim 17, wherein the analysis device includes a device that compares results obtained by the first device, the second device and the third device to determine a focused position of the optical microscope.

19. A particle defect examination apparatus according to claim 18, wherein the analysis device determines a focused position of the optical microscope when the first device, the second device and the third device provide generally the same positional information.

20. A particle defect examination apparatus according to claim 18, wherein the analysis device allows a selection of one of the results obtained by the first device, the second device and the third device when the first device, the second device and the third device provide different positional information.

* * * * *